(12) United States Patent
Wallerath et al.

(10) Patent No.: US 11,418,020 B2
(45) Date of Patent: Aug. 16, 2022

(54) TESTING DEVICE, OVERCURRENT PROTECTOR, AND METHOD OF TESTING AN OVERCURRENT PROTECTOR

(71) Applicant: Aptiv Technologies Limited, St. Michael (BB)

(72) Inventors: Jörg Wallerath, Dublin (IE); Emmanuel Boudoux, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/374,747

(22) Filed: Jul. 13, 2021

(65) Prior Publication Data

US 2022/0102959 A1    Mar. 31, 2022

(30) Foreign Application Priority Data

Sep. 29, 2020  (EP) .................................... 20199050

(51) Int. Cl.
*H02H 9/00*   (2006.01)
*H02H 3/04*   (2006.01)
*H02H 3/05*   (2006.01)

(52) U.S. Cl.
CPC .............. *H02H 3/044* (2013.01); *H02H 3/05* (2013.01)

(58) Field of Classification Search
CPC ....... H02H 3/044; H02H 3/05; G01R 31/2827
USPC .................................................. 361/56, 93.1
See application file for complete search history.

(56) References Cited

U.S. PATENT DOCUMENTS

| 8,232,808 B2* | 7/2012 | Kimura | H03K 17/56 324/629 |
|---|---|---|---|
| 2011/0084715 A1 | 4/2011 | Stan et al. | |
| 2013/0214806 A1 | 8/2013 | Saloio, Jr. et al. | |

FOREIGN PATENT DOCUMENTS

| CN | 111562494 | 8/2020 |
|---|---|---|
| EP | 2883068 | 6/2015 |
| WO | 2017071413 | 5/2017 |

OTHER PUBLICATIONS

"Extended European Search Report", EP Application No. 20199050. 4, dated Mar. 4, 2021, 5 pages.

* cited by examiner

*Primary Examiner* — Jared Fureman
*Assistant Examiner* — Lucy M Thomas
(74) *Attorney, Agent, or Firm* — Sawtooth Patent Group PLLC

(57) ABSTRACT

Testing device for testing an overcurrent protector, and method of operating the same. First and second switches are provided for connecting the first and second terminals of the overcurrent protector to first and second capacitors, respectively. The first and second capacitors are pre-charged to first and second voltages, where the second voltage is lower than the first. A controller switches the first and second switches to their test positions, which establishes a current path from the first capacitor to the second capacitor through the overcurrent protector. The first and second voltages are selected so that the peak current that would be generated in the current path is greater than the overcurrent threshold of the overcurrent protector.

20 Claims, 4 Drawing Sheets

TESTING DEVICE, OVERCURRENT PROTECTOR, AND METHOD OF TESTING AN OVERCURRENT PROTECTOR

CROSS-REFERENCE TO RELATED APPLICATION

This application claims priority to European Patent Application Number 20199050.4, filed Sep. 29, 2020, the disclosure of which is hereby incorporated by reference in its entirety herein.

INTRODUCTION

The present disclosure relates to a testing device for an overcurrent protector, and an overcurrent protector incorporating the same. The present disclosure particularly relates to self-test circuits and overcurrent protection devices for use in a power supply for a multi domain controller and other vehicle electronic control units. The present disclosure further relates to a method of testing an overcurrent protector.

BACKGROUND

Safety critical electronic devices such as multi domain controllers for self-driving road vehicles require safety devices to identify failure situations and take action to protect components and operations. This requirement applies not only to the operations of CPUs and controllers, but to the power supplies which drive these components. As such, power supply units in automotive applications typically have an overcurrent protector (OCP) circuit for protecting loads from abnormal current conditions caused by, for example, short circuits. For instance, a short resulting in a failure of a regulated power supply to the battery voltage could lead to electrical over-stress to the supplied load circuit. However, such overcurrent protectors often need to themselves be tested at system power-up to confirm they are functioning correctly. Accordingly, overcurrent protectors often incorporate, or are associated with, self-test circuits which subject the overcurrent protector to a simulated overcurrent event to verify it is functioning correctly.

US2013/0214806 discloses one such conventional self-test circuit for an overcurrent protector. In this arrangement, a capacitor is charged and dis-charged using high and low-side switches with the test current being measured with a high-side shunt resistor and being actively monitored during the test through monitoring circuit. However, there are a number of disadvantages with this arrangement. Firstly, it requires the power supply to be capable of delivering a sufficiently high peak current to be used as a test current. This adds considerably to the complexity of the power supply because, not only does this necessitate additional controls, but also the circuitry to shape and achieve the high output current in a consistent manner. At the same time, both the test current and the voltage of the output capacitor must be actively monitored and limited to maximum current and voltage ratings. The presence of the high-side shunt resistor also causes losses during normal operation. Finally, the overcurrent protector device under test is also shorted to ground through low-side switch. This restricts the application of this type of circuit because some overcurrent protectors are too sensitive to be used when the circuit contains a hard short to ground.

The present disclosure is therefore directed to addressing these issues.

SUMMARY

According to a first aspect there is provided a testing device for testing an overcurrent protector, the overcurrent protector providing an electrical connection between a first and a second terminal which is interrupted when a current between the first and second terminals exceeds an overcurrent threshold, the device comprising: a first switch switchable to a test position for connecting the first terminal to a first capacitor; a second switch switchable to a test position for connecting the second terminal to a second capacitor; a pre-charging circuit for charging the first capacitor to a first voltage and the second capacitor to a second voltage, wherein the second voltage is lower than the first; and a controller for switching the first and second switches to their test positions for establishing a current path from the first capacitor to the second capacitor through the overcurrent protector, wherein the first and second voltages are set to generate a peak current in the current path greater than the overcurrent threshold.

In this way, an overcurrent event may be simulated using the difference between the voltages at the two capacitors. As such, an overcurrent protector used for protecting a load may be self-tested by subjecting it to the simulated event. Importantly, a sufficiently high peak current for triggering the overcurrent protector may be generated, without requiring the regular power supply used to supply the load to deliver this function. At the same time, the arrangement also avoids the need to short the overcurrent protector to ground. That is, the current flow is generated by the balancing action between the voltages at the two capacitors either side of the overcurrent protector. Consequently, rather than shorting to a hard ground, the current flows to the lower second voltage at the second capacitor. This thereby allows the testing device to be used with a broader range of overcurrent protectors, which may otherwise be too sensitive for grounded circuit configurations.

In embodiments, the first capacitor for connection to the first terminal and the second capacitor for connection to the second terminal. In this way, the testing device circuit may be provided as a unit including the capacitors. Alternatively, embodiments may repurpose existing capacitors from adjacent circuitry by connecting them, with a switch, to the overcurrent protector for generating the balancing current therebetween.

In embodiments, at least one of the first and second capacitors are grounded. This thereby fixes the electrical potential of the grounded plate and simplifies the charging of the positive plate. In embodiments, at least one of the first and second capacitors is polarised. This thereby allows for a higher capacity energy store.

In embodiments, the testing device further comprises a resistor connected along the current path for limiting the current. This thereby regulates the balancing current in the current path. Advantageously, with this arrangement, the resistor is provided in the testing current path, rather than in the regular power supply line to the load. Consequently, the resistor does not contribute to losses during normal operation of the device under test.

In embodiments, the resistor is connected between the first capacitor and the first switch.

In embodiments, the first and second switches are switchable to an operating position in which the first and second switches connect the first and second terminals to a power source and a load, respectively. In this way, the testing device may switch the overcurrent protector between an operating position where the normal power supply line to the load is connected, and a testing position where the overcurrent protector is disconnected from the regular power supply and load, and is instead connected to the capacitors. As such, a simulated overcurrent event may be generated in a testing current path which is independent of the regular current path for supplying the load in normal operation.

In embodiments, the pre-charging circuit comprises one or more pre-charging switches for connecting the first and second capacitors to a pre-charging power source for charging to the first and second voltages, respectively. In this way, the capacitors may be pre-charged as part of a test sequence where they are first connected to the pre-charging power source for charging, and then are connected to the overcurrent protector. The controller may control the switching of the associated switches for implementing the test sequence.

In embodiments, the controller switches the first and second switches to their test positions for a predetermined test duration, wherein the predetermined test duration is longer than a specified maximum reaction time of the overcurrent protector. In this way, if the overcurrent protector is operating correctly, it will have interrupted the current flow within its specified maximum reaction time. Conversely, a defective overcurrent protector will have allowed the balancing current flow between the capacitors to continue beyond the specified maximum reaction time.

In embodiments, the testing device further comprises an evaluation module for identifying a fault in the overcurrent protector based the voltage at one of the first and second capacitors after the predetermined test duration. Accordingly, the fault status of the overcurrent protector may be determined based on the voltage level at either of the capacitors at the end of the predetermined test duration.

According to a second aspect, there is provided an overcurrent protector comprising the testing device according to any of the above statements. In this way, an combined device is provided for overcurrent protection and for undertaking self-tests to validate its operational status.

According to a third aspect, there is provided an method of testing an overcurrent protector, the overcurrent protector providing an electrical connection between a first and a second terminal which is interrupted when a current between the first and second terminals exceeds an overcurrent threshold, the method comprising the steps of: pre-charging, using a pre-charging circuit, a first capacitor to a first voltage and a second capacitor to a second voltage, wherein the second voltage is lower than the first; and controlling, using a controller, first and second switches to switch to test positions for connecting the first and second terminals to the first and second capacitors for establishing a current path from the first capacitor to the second capacitor through the overcurrent protector, wherein the first and second voltages are set to generate a peak current in the current path greater than the overcurrent threshold.

In this way, a testing method is provided in which an overcurrent event is simulated using the balancing current created by the difference between the voltages at the two capacitors. This thereby allows a sufficiently high peak current for triggering the overcurrent protector to be generated, without requiring the regular power supply used to supply the load to deliver this function, or needing to short the overcurrent protector to ground.

In embodiments, the step of controlling the first and second switches comprises switching the first and second switches to the test positions from operating positions in which the first and second switches connect the first and second terminals to a power source and a load, respectively.

In embodiments, the step of pre-charging comprises switching one or more pre-charging switches to connect the first and second capacitors to a pre-charging power source for charging to the first and second voltages, respectively.

In embodiments, the step of controlling comprises switching the first and second switches to their test positions for a predetermined test duration, wherein the predetermined test duration is longer than a specified maximum reaction time of the overcurrent protector.

In embodiments, the step of controlling comprises identifying, using an evaluation module, a fault in the overcurrent protector based the voltage at one of the first and second capacitors after the predetermined test duration. In this way, a fault may be identified if the change in voltage at either capacitor exceeds a threshold corresponding to the expected change in voltage arising from the balancing current flow over the overcurrent protector's specified maximum reaction time. For example, if the second capacitor's voltage at the end of the test is higher than a maximum expected voltage, then the overcurrent protector must have failed to interrupt the balancing current within the specified maximum reaction time. Equally, the same fault may also be identified if the first capacitor's voltage at the end of the test is less than a minimum expected voltage. The expected voltages may be pre-determined or dynamically applied. Furthermore, the thresholds may be set to account for tolerances and circuit losses.

BRIEF DESCRIPTION OF THE DRAWINGS

Illustrative embodiments will now be described with reference to the accompanying drawing in which.

DETAILED DESCRIPTION

Figure 1:
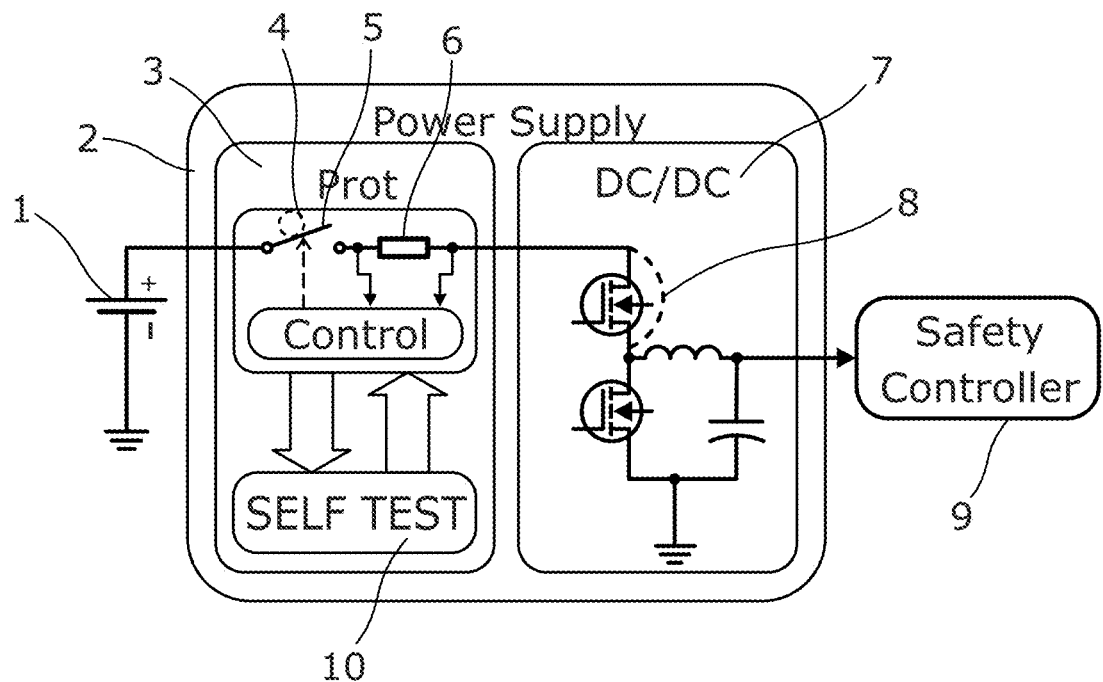
FIG. 1 shows a schematic overview of a power supply incorporating a self-test testing circuit.

FIG. 1 shows an illustrative arrangement of a power supply 2 supplying a Multi-Domain Safety Controller 9. The power supply 2 receives power from the battery 1, and comprises a protection circuit 3 and a DC/DC converter 7, which may be part of a power management integrated circuit (PMIC). The protection circuit 3 comprises an overcurrent protector 4 which includes a switch 5 which provides a circuit breaker for protecting the Safety Controller 9 from an over current event. In this example, the protection block 3 is placed in front of the pre-regulator of the DC/DC converter 7. However, it will be understood that the protection block 3 may be located after the pre-regulator.

In an overcurrent event, such as short 8 around the pre-regulator high side transistor, the rising input current will be detected by sensor 6 within the overcurrent protector 4, which then prompts the switch 5 to break the circuit and thereby stop the current flow.

In order to comply with Automotive Safety Integrity Level (ASIL) requirements, the protection block 3 is provided with a self-test circuit 10 for testing the operating status of the overcurrent protector 4.

Figure 2:
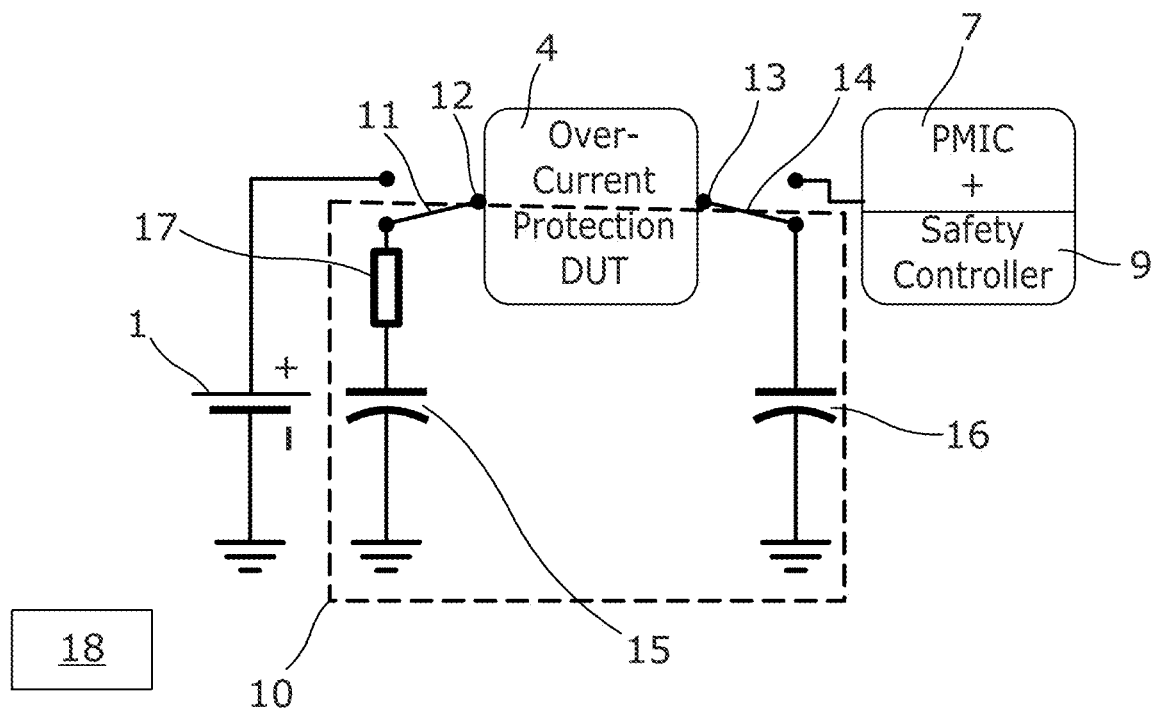
FIG. 2 shows a schematic circuit diagram of a first embodiment of a testing circuit.

FIG. 2 shows a self-test circuit 10 according to an illustrative embodiment. The self-test circuit 10 is connectable to the first and second terminals 12,13 of the overcurrent protector 4, via switches 11 and 14. In this embodiment, the switches are provided as back-to-back NMOSFETs. The switches 11 and 14 are operable to switch between an operating position and a test position. In the operating position, the first and second terminals 12,13 are respectively connected to the battery 1 and the PMIC 7 and safety controller 9. In the test position, the first and second terminals 12,13 are connected to the first and second capacitors 15,16 for performing a test. Therefore, when in the test position, the device under test, namely the overcurrent protector 4, is dis-connected from its regular power supply (i.e. battery 1) and load (safety controller 9) and is instead connected to the self-test circuit.

The first capacitor 15 is connectable to the first terminal 12, and the second capacitor 16 is connectable to the second terminal 13. A balancing resistor 17 is further provided between the first capacitor 15 and the first terminal 12. A pre-charging circuit (not shown) is further provided to pre-charge the first and second capacitors prior to a test sequence being initiated.

When a test sequence is initiated, the controller 18 switches the first and second switches 11,14 to connect the first and second terminals 12,13 to the first and second capacitors 15,16. This establishes a current balancing arrangement between the pre-charged capacitors 15,16 and through the overcurrent protector 4. By pre-charging the first capacitor 15 to a higher voltage than the second capacitor 16, a balancing current is thereby established through the overcurrent protector 4. For instance, the first and second capacitors 15,16 may be pre-charged with voltages $V_1$ and $V_2$, respectively, where for example $V_1 = 2 \cdot V_2$. The component values of the resistor 17 and first and second capacitors 15,16, and the pre-charge voltages $V_1$ and $V_2$ are selected such that balancing current between the capacitors during the test is above the overcurrent detection threshold for a longer period of time than the overcurrent protector's maximum specified reaction time.

In this connection, if the overcurrent protector 4 is working correctly, balance between the voltage levels of the capacitors 15,16 will not be reached by the end of the testing period because the overcurrent protector 4 will have broken the circuit. Consequently, a test PASS or FAIL decision about the operational status of the overcurrent protector can be made based on the voltage levels across either of the capacitors at the end of the test. Accordingly, this arrangement avoids the need to actively monitor current during the test, and at the same time the maximum voltage and current levels are limited by the inherent properties of the components used, rather than necessitating complex control.

The arrangement also eliminates the need for a high-side current monitor since the test current is neither directly measured nor controlled. Moreover, the input power supply (i.e the battery 1 in this embodiment), is not required to provide the instantaneous peak energy needed for the test current, since this is instead provided by the pre-charged first capacitor 15 acting as a buffer. Furthermore, the elimination of the shunt resistor reduces losses in the main current path during normal operation. At the same time, neither voltage nor current regulation is required because all signals are pre-defined by component selection.

As an illustrative example, the circuit shown in FIG. 2 may be configured with the following specification:

$1^{st}$ Capacitor 15 = $2^{nd}$ Capacitor 16 = 20 µF±30%

Voltage of $1^{st}$ Capacitor 15 at start of test = 10V±5%

Voltage of $2^{nd}$ Capacitor 16 at start of test = 5V±5%

Resistor 17 = 0.5 Ω±5%

Overcurrent protector 4 current threshold = 4 A

Maximum specified reaction time $(t_{react.DUT.spec.max}) = 2$ µs±100 ns

Test duration $(t_{test.dur}) = 3$ µs

With the above test parameters, the following calculated voltage and current levels will apply:

Peak Current = 10A

Current at 2 µs after test start(treact.DUT.spec.max)≈6.7 A

Voltage at 1st Capacitor 15 at test end≈9.2V

Voltage at 2nd Capacitor 16 at test end≈5.8V

With the above specification, the tolerance of the expected voltage of the second capacitor 16 by the end of the test can be calculated as:

Tolerated difference in V at end of test≈0.61V

Tolerated difference in V at end of test≈10.3%

The additional decrease of the expected voltage of the $2^{nd}$ capacitor 16 by the end of the test resulting from the losses caused by the voltage drop of the test current on both the resistor 17 and the circuit components of the overcurrent protector 4 may also be estimated as:

$$R_{tot} = R_{Bal} + ESR_{c1} + ESR_{c2} + R_{DUT} (\approx 100 \text{ m}\Omega)$$

where $R_{tot}$ is the total resistance, $R_{Bal}$ is the resistance of resistor 17 (500 mΩ in this example), $ESR_{c1}$ and $ESR_{c2}$ are the equivalent series resistance values for the first and second capacitors, and $R_{DUT}$ is the internal resistance of the device under test (i.e. overcurrent protector 4).

Figure 3:
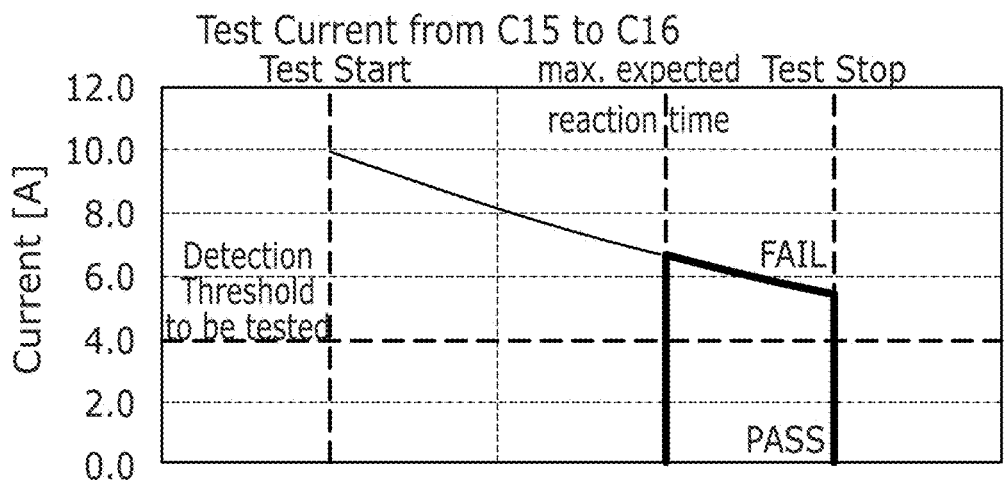
FIG. 3 shows a graph illustrating the change in current flowing through the testing circuit during an example test.
Figure 4:
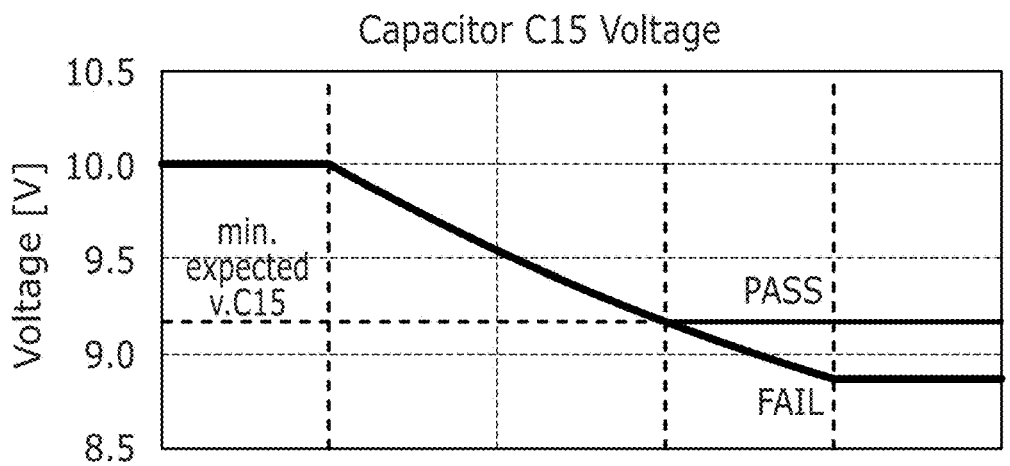
FIGS. 4 and 5 show graphs illustrating the change in voltage at the first and second capacitors during an example test.
Figure 5:
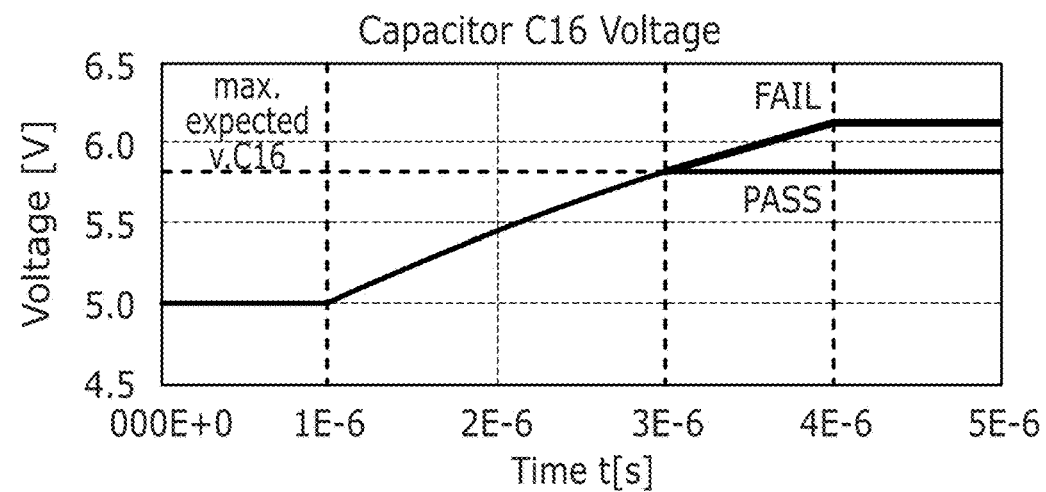

FIGS. 3 to 5 shows graphs illustrating the change in current, and the voltage at each capacitor, during an example test. As shown in FIG. 3, once the capacitors are connected to the overcurrent protector, the generated current exceeds the overcurrent protector's detection threshold. As shown in FIGS. 4 and 5, this coincides with the discharging of voltage from the first capacitor 15 to the second capacitor 16. If the overcurrent device 4 is working correctly, the current will be interrupted by the specified maximum reaction time, as shown in FIG. 3, which thereby fixes the voltages at each capacitor at an expected level. However, if the overcurrent device 4 is not working correctly, the current will continue to flow beyond the specified maximum reaction time, as shown in FIG. 3. This results in a greater change in voltage at each of the capacitors, with the first capacitor 15 discharging to a lower voltage level than expected, and the second capacitor 16 charging to a higher voltage than expected. Accordingly, a fault can be identified by evaluating the voltage level at one of the capacitors at the end of the test. Furthermore, because the first and second switches 11,14 can disconnect the capacitors 15,16 at the end of the test, there is no need to undertake a very rapid evaluation of the capacitor voltage.

FIGS. 6 to 10 show a self-test circuit according to a second illustrative embodiment, with the figures showing the switching sequence through the various stages of the test. This embodiment is substantially the same as the first embodiment, but the first and second switches 11,14 are 3-way switches, and the circuit 10 further comprises a first pre-charging source 19 connected to the first capacitor 15 via a first pre-charging switch 20, and a second pre-charging source 21 connected to the second capacitor 16 via a second pre-charging switch 22. The first and second pre-charging switches 20 and 22 are operable under the control of the self-test controller 18.

Figure 6:
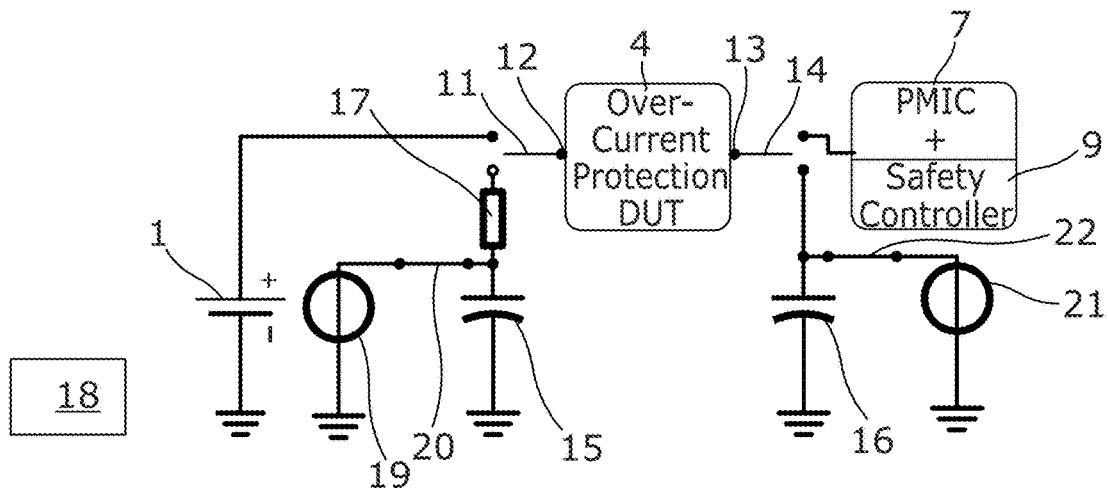
FIGS. 6 to 10 show schematic circuit diagrams of a testing circuit according to a second embodiment though the steps of the test sequence.
Figure 7:
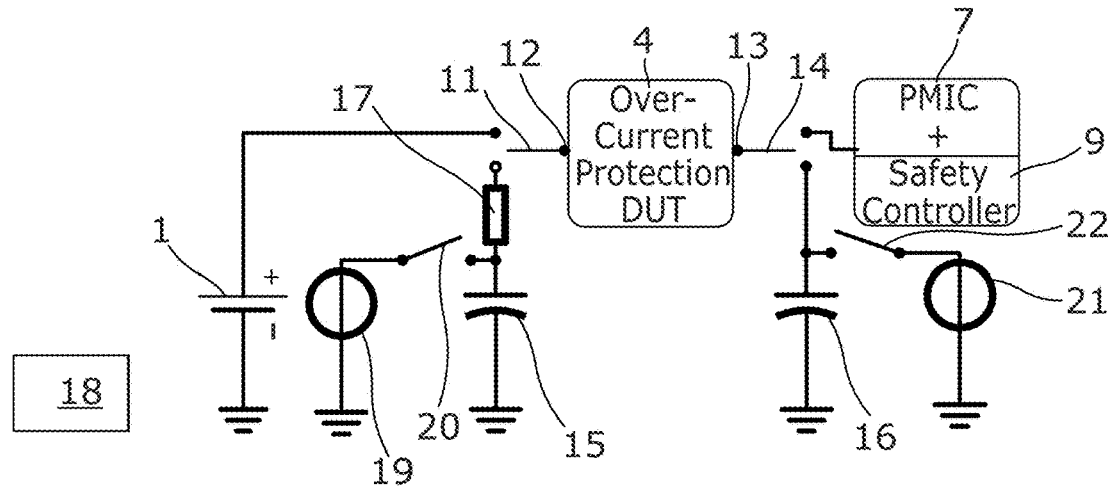

In FIG. 6, the circuit is in a pre-charging configuration where the first and second pre-charging switches 20,22 connect the first and second capacitors 15,16 to charge them to the voltages $V_1$ and $V_2$, respectively. Once the capacitors 15,16 are charged, the first and second pre-charging switches 20,22 disconnect the pre-charging sources 19,21, as shown in FIG. 7.

Figure 8:
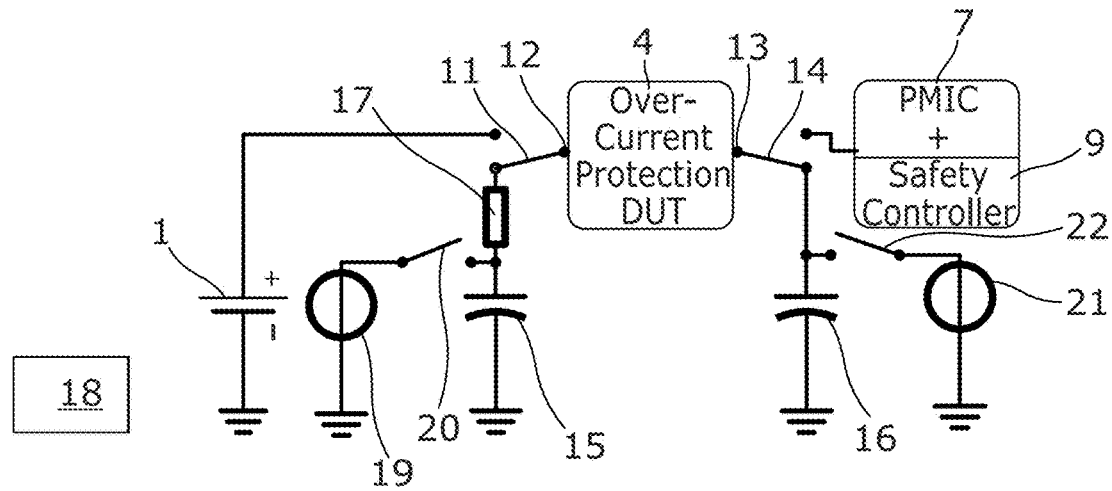

FIG. 8 shows the circuit is in the start test configuration, with the first and second switches 11,14 operated to connect the first and second capacitors 15,16 to the first and second terminals 12,13 via the resistor 17. This establishes the current flow from the first capacitor 15 to the second capacitor 16. If the over current protector 4 is operating correctly, it should interrupt the current flow within the maximum specified reaction time $t_{react.DUT.spec.max}$.

Figure 9:
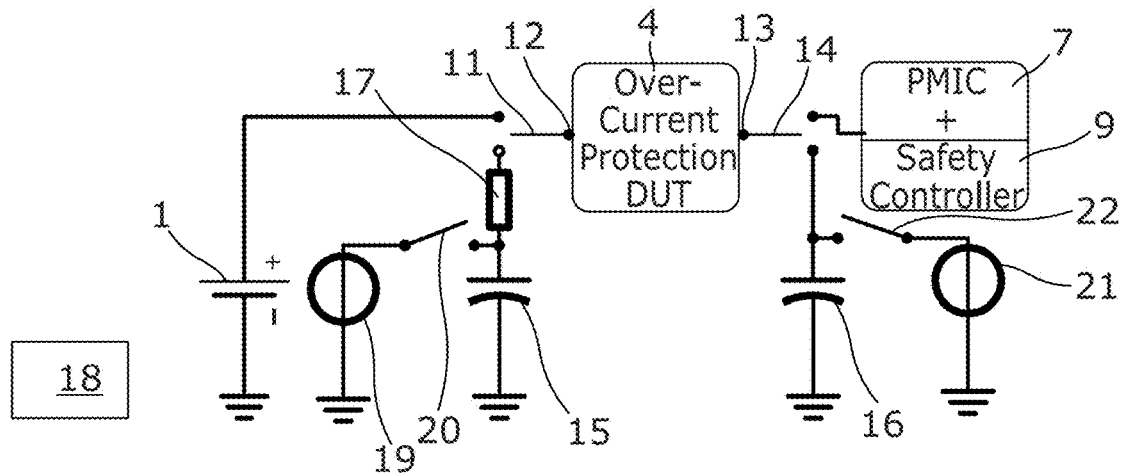
Figure 10:
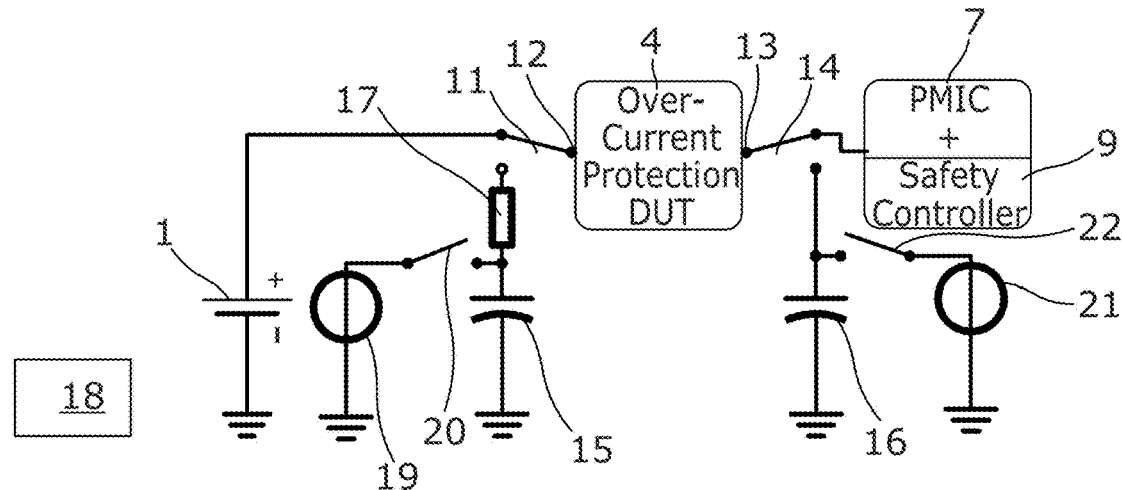

After a predetermined test duration, $t_{test.dur}$, which is longer than $t_{react.DUT.spec.max}$, the self-test controller 18 switches the circuit to the disconnected configuration shown in FIG. 9 and evaluates the voltage at the second capacitor 16 using an evaluation circuit (not shown). If the second capacitor 16 voltage exceeds a threshold indicating that the overcurrent protector 4 did not interrupt the current flow within $t_{react.DUT.spec.max}$, a fault is identified. Conversely, if the second capacitor 16 voltage is below the threshold, the current flow was successfully interrupted, and the overcurrent protector 4 has passed the self-test. In other embodiments, the self-test controller 18 may alternatively evaluate the retained voltage at the first capacitor 15, with a voltage drop below to a threshold indicating an overcurrent protector failure and a voltage drop within the threshold indicating a pass.

In the event of a self-test pass, the self-test controller 18 may operate the first and second switches 11,14 to connect the terminals 12,13 to the battery 1 and the PMIC 7 and safety controller 9.

Figure 11:
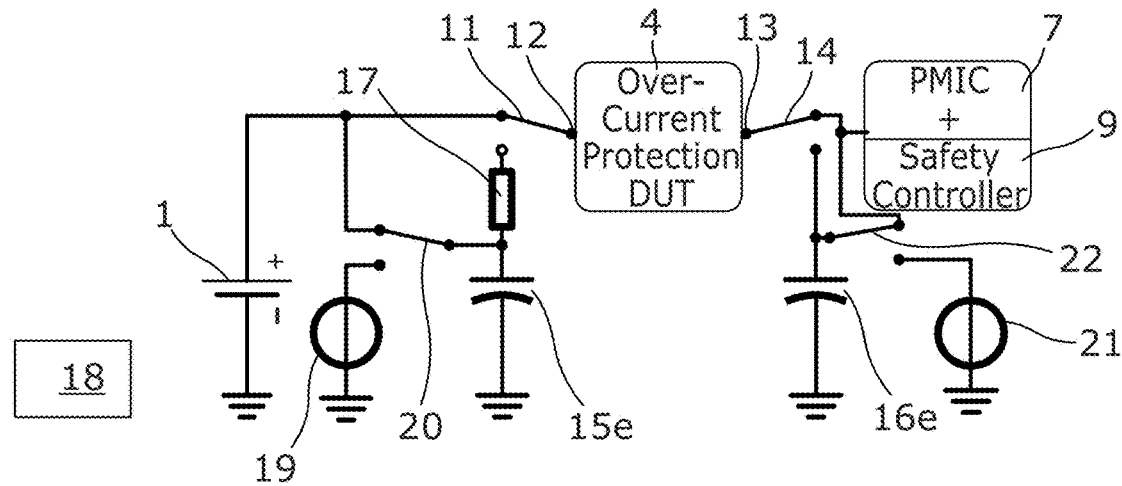
FIG. 11 shows a schematic circuit diagram of a testing circuit according to a third embodiment.

FIG. 11 shows a third embodiment in which existing capacitors within the application circuit are re-purposed for use in the self-test circuit. In this example, the overcurrent protector 4 comprises associated input circuitry including existing capacitors 15e and 16e. The existing capacitors 15e and 16e can be switched by pre-charging switches 20,22 to disconnect them from the input circuitry (as shown in FIG. 11) to first pre-charge them using pre-charge sources 19,21, and then to an unconnected state for running the self-test in line with the previous embodiments. In this way, existing capacitors may be temporarily re-purposed for the self-test, thereby providing component cost and space savings.

With the above arrangements, an overcurrent protector may be tested without having the device shorted to ground. This thereby allows the self-test circuit to be used with a broader range of overcurrent protection devices. Furthermore, as the maximum voltages and currents are pre-defined by component selection, higher voltages and currents cannot occur, even in the event of a fault. This thereby improves safety and reliability. Moreover, as the self-test circuit does not require a shunt resistor or active current monitoring, the arrangement saves space, and reduces losses and costs. Moreover, because the current is not monitored actively, the control and test evaluation steps may be implemented relatively slowly, thereby increasing the simplicity of the self-test controller and hence further reducing costs.

It will be understood that the embodiments illustrated above show applications only for the purposes of illustration. In practice, embodiments may be applied to many different configurations, the detail of which being straightforward for those skilled in the art to implement.

For example, although in the above illustrative embodiments the testing circuit has been described as a separate device, it will be understood that the circuit may be incorporated into the overcurrent protector unit.

What is claimed is:

1. An apparatus comprising:
    a testing device for testing a current between first and second terminals of an overcurrent protector that is configured to interrupt the current when the current exceeds an overcurrent threshold, the testing device comprising:
    a first switch configured to switch to a test position for connecting the first terminal to a first capacitor;
    a second switch configured to switch to a test position for connecting the second terminal to a second capacitor;
    a pre-charging circuit configured to charge the first capacitor to a first voltage and charge the second capacitor to a second voltage, the second voltage being lower than the first; and
    a controller configured to switch the first and second switches to the test positions for establishing a current path for the current to pass through the overcurrent protector from the first capacitor to the second capacitor,
    the first and second voltages are selected to generate a peak current in the current path greater than the overcurrent threshold voltage.

2. The apparatus according to claim 1, further comprising:
    the first capacitor for connection to the first terminal; and
    the second capacitor for connection to the second terminal.

3. The apparatus according to claim 2, wherein at least one of the first and second capacitors is grounded.

4. The apparatus according to claim 1, further comprising:
    a resistor connected to the current path and configured to limiting the current.

5. The apparatus according to claim 4, wherein the resistor is connected between the first capacitor and the first switch.

6. The apparatus according to claim 1, wherein the first and second switches are further configured to switch to an operating position where the first and second switches connect the first and second terminals to, respectively, a power source and a load.

7. The apparatus according to claim 1, wherein the pre-charging circuit comprises one or more pre-charging switches configured to connect the first and second capacitors to a pre-charging power source for charging to, respectively, the first and second voltages.

8. The apparatus according to claim 1, wherein the controller is configured to switch the first and second switches to the test positions for a predetermined test duration that is longer than a specified maximum reaction time of the overcurrent protector.

9. The apparatus according to claim 8, further comprising:
    an evaluation module configured to identify a fault in the overcurrent protector, after the predetermined test duration, based the voltage at one of the first and second capacitors.

10. A system comprising:
    an overcurrent protector configured to interrupt a current between first and second terminals when the current exceeds an overcurrent threshold; and a testing device configured to test whether the current exceeds the overcurrent threshold, the testing device comprising:
  a first switch configured to switch to a test position for connecting the first terminal to a first capacitor;
  a second switch configured to switch to a test position for connecting the second terminal to a second capacitor;
  a pre-charging circuit configured to charge the first capacitor to a first voltage and charge the second capacitor to a second voltage, the second voltage being lower than the first; and
  a controller configured to switch the first and second switches to the test positions for establishing a current path for the current to pass through the overcurrent protector from the first capacitor to the second capacitor,
the first and second voltages are selected to generate a peak current in the current path greater than the overcurrent threshold.

11. The system of claim 10, further comprising:
the first capacitor for connection to the first terminal; and
the second capacitor for connection to the second terminal.

12. The system of claim 11, wherein at least one of the first and second capacitors is grounded.

13. The system of claim 10, further comprising:
a resistor connected to the current path and configured to limit the current.

14. The system of claim 13, wherein the resistor is connected between the first capacitor and the first switch.

15. The system of claim 10, wherein the system is configured for use in a vehicle, the system further comprising:
  a power source configured for use in the vehicle; and
  a load configured for use in the vehicle,
  wherein the first and second switches are further configured to switch to an operating position where the first and second switches connect the first and second terminals to, respectively, the power source and the load.

16. A method comprising:
testing a current between first and second terminals of an overcurrent protector that is configured to interrupt the current when the current exceeds an overcurrent threshold, the testing comprising:
  pre-charging, using a pre-charging circuit, a first capacitor to a first voltage and a second capacitor to a second voltage, wherein the second voltage is lower than the first; and
  controlling, using a test device, first and second switches to operate in test positions for connecting the first and second terminals to the first and second capacitors for establishing a current path for the current through the overcurrent protector between the first capacitor and the second capacitor,
  wherein the first and second voltages are selected to generate a peak current in the current path greater than the overcurrent threshold.

17. The method of claim 16, wherein controlling the first and second switches comprises switching the first and second switches, from operating positions in which the first and second switches connect the first and second terminals to a power source and a load, to the test positions of the first and second switches.

18. The method of claim 16, wherein pre-charging the first and second capacitors comprises switching one or more pre-charging switches to connect the first and second capacitors to a pre-charging power source for charging to the first and second voltages, respectively.

19. The method of claim 16, wherein controlling the first and second switches comprises switching the first and second switches to the test positions for a predetermined test duration that is longer than a specified maximum reaction time of the overcurrent protector.

20. The method of claim 19, wherein controlling the first and second switches identifying, using an evaluation module, a fault in the overcurrent protector based the voltage at one of the first and second capacitors after the predetermined test duration.

* * * * *